United States Patent [19]

Chaki

[11] Patent Number: 4,480,489
[45] Date of Patent: Nov. 6, 1984

[54] CRANK MECHANISM IN A PUSHBUTTON TUNER

[75] Inventor: Takao Chaki, Tokyo, Japan

[73] Assignee: Clarion Co., Ltd., Tokyo, Japan

[21] Appl. No.: 327,980

[22] Filed: Dec. 7, 1981

[30] Foreign Application Priority Data

Dec. 12, 1980 [JP] Japan .................................. 55-177588

[51] Int. Cl.³ .............................................. F16H 35/18
[52] U.S. Cl. ..................................... 74/10.33; 74/108; 74/409
[58] Field of Search ...................... 74/409, 440, 10.33, 74/10.8

[56] References Cited

U.S. PATENT DOCUMENTS 3,618,411  12/1969  Rottweiler ........................... 474/183
3,757,590   9/1973  Mears ................................. 74/10.33

Primary Examiner—Lawrence J. Staab
Assistant Examiner—Michael J. Gonet
Attorney, Agent, or Firm—Flynn, Thiel, Boutell & Tanis

[57] ABSTRACT

A crank mechanism in a pushbutton tuner which comprises a side plate secured on associated one end of crank bars and a crank gear mounted on the outer surface of the side plate, both being supported together by a caulked shaft and one of the crank gear and the side plate being formed with a protuberance formed by deforming a part thereof while the other is formed with a hole for receiving the protuberance.

2 Claims, 6 Drawing Figures

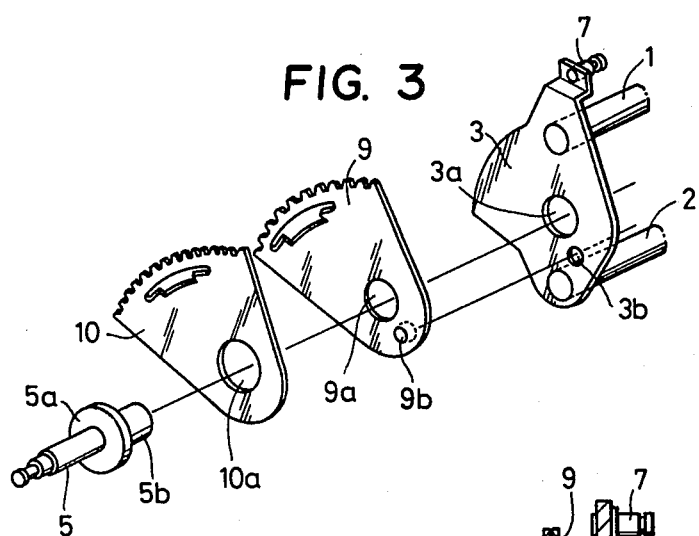
FIG. 3
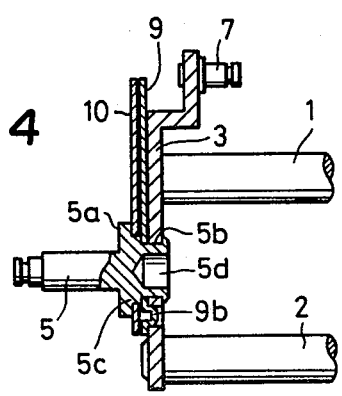
FIG. 4
FIG.5(a)    FIG.5(b)
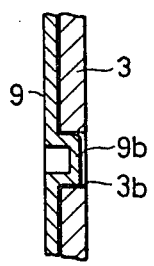   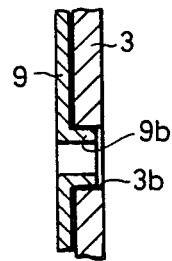

CRANK MECHANISM IN A PUSHBUTTON TUNER

BACKGROUND OF THE INVENTION

1. Field of the Invention

This invention relates to a crank in a pushbutton tuner, and more particularly to a structure of a crank mechanism comprising side plates and a crank gear to be fixed on the side plates.

2. Description of the Prior Art

A pushbutton tuner is generally arranged to perform the tuning operation when rotating a crank to a predetermined extent by pushing a pushbutton and thereby inserting a tuning core interlocking the crank in a coil. Further, in such pushbutton tuner there is provided a manually tuning dial in addition to the above described tuning assembly by means of the pushbutton. When the dial is rotated, the crank is also rotated to a desired extent thus to tune the receiver at a station other than that selected by the pushbutton and to perform fine adjustment during the tuning operation. In this case, if the crank is kept connected to the tuning dial even upon operating the pushbutton, load becomes so large to disturb a smooth operation of the pushbutton. In this connection, there has been provided a clutch assembly between the crank and the tuning dial for releasing their engagement, thus reducing the load.

A pushbutton tuner of such type as shown in FIGS. 1 and 2 has been conventionally known. Side plates 3 and 4 are fixed at both sides of an upper and lower crank bars 1 and 2 by caulking and brazing manner. The side plates are formed with shafts 5 and 6 protruding thereon for allowing the crank to be supported on a frame of the tuner as well as crank pins 7 and 8 inwardly turning at the upper ends thereof for engaging a member for mounting a core of the tuner on. A crank gear 9 for transmitting rotational force between the crank and the clutch assembly is secured on the outer surface of the side plate 3. On the outer surface of the crank gear 9 there is rotatably mounted a gear 10 for preventing backlash between the crank gear 9 and a clutch gear of the clutch assembly.

In such conventional crank, there has been adopted the following means in order to fix the crank gear 9 with respect to the side plate 3. That is, the shaft 5 is inserted in a shaft bore at the center of the crank gear 9 to be held between a flange 5a formed on the shaft 5 and the side plate 3. Consequently the side plate 3 and the shaft 5 are secured to each other by caulking manner. With this arrangement, the crank gear 9 is still permitted to rotate about the shaft bore (shaft 5). Therefore, there has been proposed to provide associated through bores in portions other than the center shaft bores of the side plate 3 and the crank gear 9 for inserting a pin 11 therein and to caulk the pin 11, thus fixing the crank gear 9 with respect to the side plate 3 at two portions namely the shaft 5 and the pin 11.

However, since such fixing manner requires the pin 11 which is an independent member, it has had a drawback of increasing the number of parts as well as the weight of the crank. Further, when caulking the pin 11, the deformed head of the pin 11 protrudes on the surface of the crank gear 9. Therefore, in order to prevent the protruding portion from contacting with the backlash preventing gear 10, the pin 11 has to be mounted in a portion radially outward of the gear 10. In this connection, the side plate 3 and the crank gear 9 have to be so formed as to largely radially extend as shown in FIG. 2, resulting in requiring a large space for mounting the parts in. Further, the conventional fixing manner has been disadvantageous as requiring more manhour because caulking has to be done not only on the shaft 5 but also on the pin 11.

OBJECT OF THE INVENTION

It is therefore an object of the present invention to solve the above-mentioned conventional drawbacks, and more specifically to provide a crank mechanism in a pushbutton tuner in which one of a crank gear or a side plate a protuberance such as a joggle, a boss, etc. while the other is formed with a hole for receiving the protuberance so that the crank gear and the side plate are fixed on each other without using a conventional pin.

SUMMARY OF THE INVENTION

In accordance with the present invention, there is provided a crank mechanism in a pushbutton tuner which comprises:

crank bars;

a side plate fixed on associated one end of said crank bars;

a crank gear mounted outwardly adjacent to said side plate;

a shaft for forcedly supporting said crank gear and said side plate together from both opposed sides of them;

a protuberance formed on any one of said crank gear and said side plate; and a hole formed in the other of said crank gear and said side plate for receiving said protuberance.

BRIEF DESCRIPTION OF THE DRAWINGS

FIG. 3 shows a perspective view of disassembled parts in an embodiment of a crank according to the present invention;

FIG. 4 shows a sectional view of the crank of FIG. 3; and

FIGS. 5 (a) (b) show enlarged sectional view illustrating the protuberance proposed by the present invention.

DETAILED DESCRIPTION OF THE DRAWINGS

Figure 1:
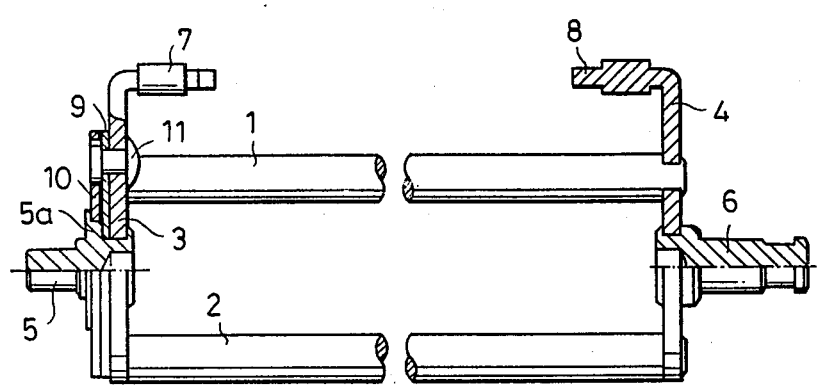
FIG. 1 shows an elevation illustrating a conventional crank.
Figure 2:
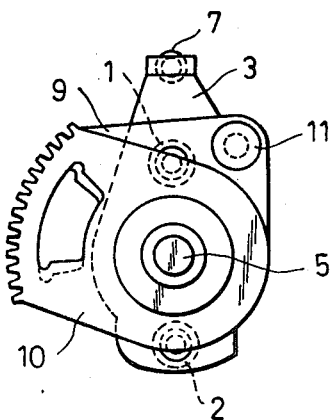
FIG. 2 shows a side view of FIG. 1.

The present invention will now be described in detail referring to the preferred embodiment illustrated in FIGS. 3 and 4 in which same members as those in FIGS. 1 and 2 are designated by the same reference numerals. Accordingly, description on those members is omitted.

The side plate 3 is formed with a shaft bore 3a as same as the conventional one and with a hole 3b apart from the shaft bore 3a for engaging with the crank gear 9. The crank gear 9 to be fixed on the side plate 3 is also formed with a shaft bore 9a as well as a protuberance 9b for being inserted in the hole 3b of the side plate 3. The protuberance 9b may be formed as being a joggle as shown in FIG. 5(a) or a boss as shown in FIG. 5(b) by pressing a part of the crank gear 9 to protrude toward the side plate 3.

On the outer side of the crank gear 9 there is mounted the backlash preventing gear 10 a shaft bore 10a of which for inserting the shaft 5 in has a diameter larger than those of the shaft bores 3a and 9a of the side plate 3 and the crank gear 9. The crank gear 9 and the backlash preventing gear 10 are connected to the side plate 3 by the shaft 5 which is caulked. That is, the shaft 5 comprises a small diameter portion 5b for being inserted in the shaft bores 3a and 9a of the side plate 3 and the crank gear 9, a large diameter portion 5c outwardly extending from the small diameter portion 5b for being inserted in the shaft bore 10a of the backlash preventing gear 10 and a flange 5a formed outward of the large diameter portion 5c. Further the shaft 5a is further formed with an axial bore within the small diameter portion 5b thereof for receiving a caulking tool. The step between the small diameter portion 5b and the large diameter portion 5c and the edge of the axial bore formed on the inner surface of the side plate 3 and the crank gear 9 therebetween. The backlash preventing gear 10 is pivotally mounted on the large diameter portion 5c and prevented from dropping out of the shaft 5 by the flange 5a.

As apparent from the above-discribed embodiment, the crank according to the present invention so arranged that the crank gear is press fit to the outer surface of the side plate by caulking the shaft and the relative rotation between the side plate and the crank gear is prevented by the protuberance and the hole for engaging with each other. Therefore, the crank gear is perfectly fixed on the outer surface of the side plate without deviating or rotating with respect to each other. Further, since the present invention realizes prevention of relative rotation of the side plate and the crank gear by means of the protuberance and the hole for engaging with each other, a stopping pin which has conventionally been requisite is not required. Therefore, it has effects such as reduction of weight due to reduction of the parts and reduction of manhour. Particularly, the fact that caulking is required only in one portion of the shaft largely distributes to reduction of manhour. Further, since the protuberance is formed as being a joggle or a boss by deforming a part of the crank gear so as to protrude toward the side plate, any protrusion does not exist on the surface facing to the backlash preventing gear. Therefore, the protuberance may be formed in a portion overlapping the backlash preventing gear, thus allowing the crank gear and the side plate to be formed smaller.

Incidentally, although the protuberance and the hole are formed in the crank gear and the side plate, respectively, in the embodiment illustrated in the drawings, the hole may be formed in the crank gear while the protuberance is formed on the side plate.

I claim:

1. In a crank mechanism in a pushbutton tuner which comprises:
   crank bars;
   a side plate fixed to one end of said crank bars;
   a crank gear located outward of said side plate;
   a shaft supporting said crank gear and said side plate;
   a backlash preventing gear mounted outward of said crank gear, said backlash preventing gear and said crank gear and said side plate being supported together by said shaft from opposite ends of said backlash preventing gear and said side plate;
   said shaft comprising a small diameter portion inserted into shaft bores respectively formed in said side plate and said crank gear, a large diameter portion outwardly extending from said small diameter portion and inserted into a shaft bore formed in said backlash preventing gear and a flange formed outward of said large diameter portion, said small diameter portion being formed with an axial bore for receiving a caulking tool, a face connecting said large diameter portion to said small diameter portion of said shaft at one end of said small diameter portion, the opposite end of said small diameter portion being enlarged by a caulking deformation, said crank gear and said side plate being pivotally supported on said small diameter portion and closely sandwiched between said face and caulking deformation, said backlash preventing gear being pivotally supported on said large diameter portion and sandwiched snugly but relatively rotatably between said crank gear and said flange; and
   means integral with said crank gear and side plate for positively preventing relative movement therebetween, said means including a protuberance formed on one of said crank gear and said side plate by deforming a part thereof, and a hole corresponding closely in size and shape to said protuberance and formed in the other of said crank gear and said side plate and snugly receiving said protuberance therein, thereby positively preventing said relative movement, said gears being mounted eccentrically on said shaft such that each gear has a radially long part carrying gear teeth on its periphery and a radially short part on the other side of said shaft from said gear teeth, the one of said protuberance and hole in said crank gear being in said radially short part thereof so as to be continuously overlaid by said booklash preventing gear regardless of the relative rotational position between said crank gear and backlash preventing gear, said protuberance and hole lying closely radially adjacent to the small diameter portion of said shaft.

2. The mechanism of claim 1 in which said gears are substantially identical in peripheral shape and size, portions of said gears overlying each other and overlying a portion of said side plate, said protuberance and hole being in portions of said crank gear and side plate overlaid by said overlying portion of said backlash preventing gear, said protuberance being axially free of interference with said backlash preventing gear and permitting rotation of said backlash preventing gear with respect to said crank gear, said flange on said shaft partially radially overlapping said protuberance and hole.

* * * * *